United States Patent
Lee

(10) Patent No.: US 10,109,373 B2
(45) Date of Patent: Oct. 23, 2018

(54) DATA STORAGE APPARATUS AND OPERATING METHOD THEREOF

(71) Applicant: SK hynix Inc., Gyeonggi-do (KR)

(72) Inventor: Dong Sop Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/646,181

(22) Filed: Jul. 11, 2017

(65) Prior Publication Data

US 2018/0151249 A1 May 31, 2018

(30) Foreign Application Priority Data

Nov. 29, 2016 (KR) .................. 10-2016-0160071

(51) Int. Cl.
| | |
|---|---|
| G11C 7/00 | (2006.01) |
| G11C 29/00 | (2006.01) |
| G11C 29/12 | (2006.01) |
| G11C 29/02 | (2006.01) |
| G11C 29/18 | (2006.01) |
| G11C 29/44 | (2006.01) |

(52) U.S. Cl.
CPC ............ *G11C 29/76* (2013.01); *G11C 29/025* (2013.01); *G11C 29/12* (2013.01); *G11C 29/18* (2013.01); *G11C 29/4401* (2013.01); *G11C 29/883* (2013.01); *G11C 2029/1204* (2013.01); *G11C 2029/4402* (2013.01)

(58) Field of Classification Search
CPC ....... G11C 29/50; G11C 29/02; G11C 999/99; G11C 29/24; G11C 11/401
USPC ................................................ 365/201, 200
See application file for complete search history.

(56) References Cited

U.S. PATENT DOCUMENTS 9,146,824 B1 * 9/2015 Chen .................. G06F 11/2268

FOREIGN PATENT DOCUMENTS

| KR | 1020030061877 | 7/2003 |
|---|---|---|
| KR | 100674544 | 1/2007 |

\* cited by examiner

*Primary Examiner* — Son Dinh
(74) *Attorney, Agent, or Firm* — IP & T Group LLP

(57) ABSTRACT

A data storage apparatus includes a nonvolatile memory device and a controller configured to determine whether or not one or more addresses of defective bit lines are included in an address of a write data to be written into the nonvolatile memory device or an address of a read data read from the nonvolatile memory device, and write the write data or read the read data by skipping the defective bit lines based on a determination result.

17 Claims, 19 Drawing Sheets

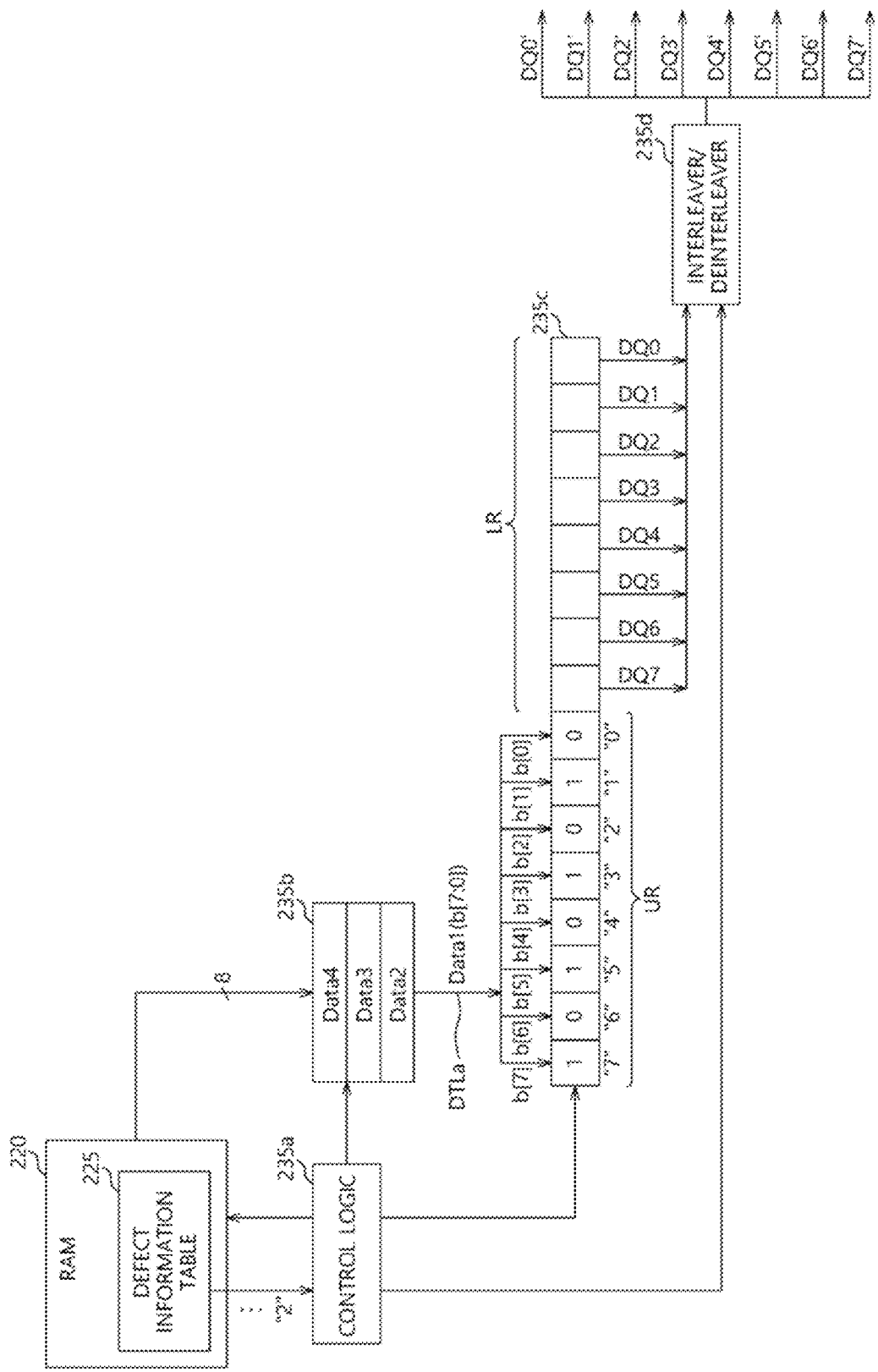

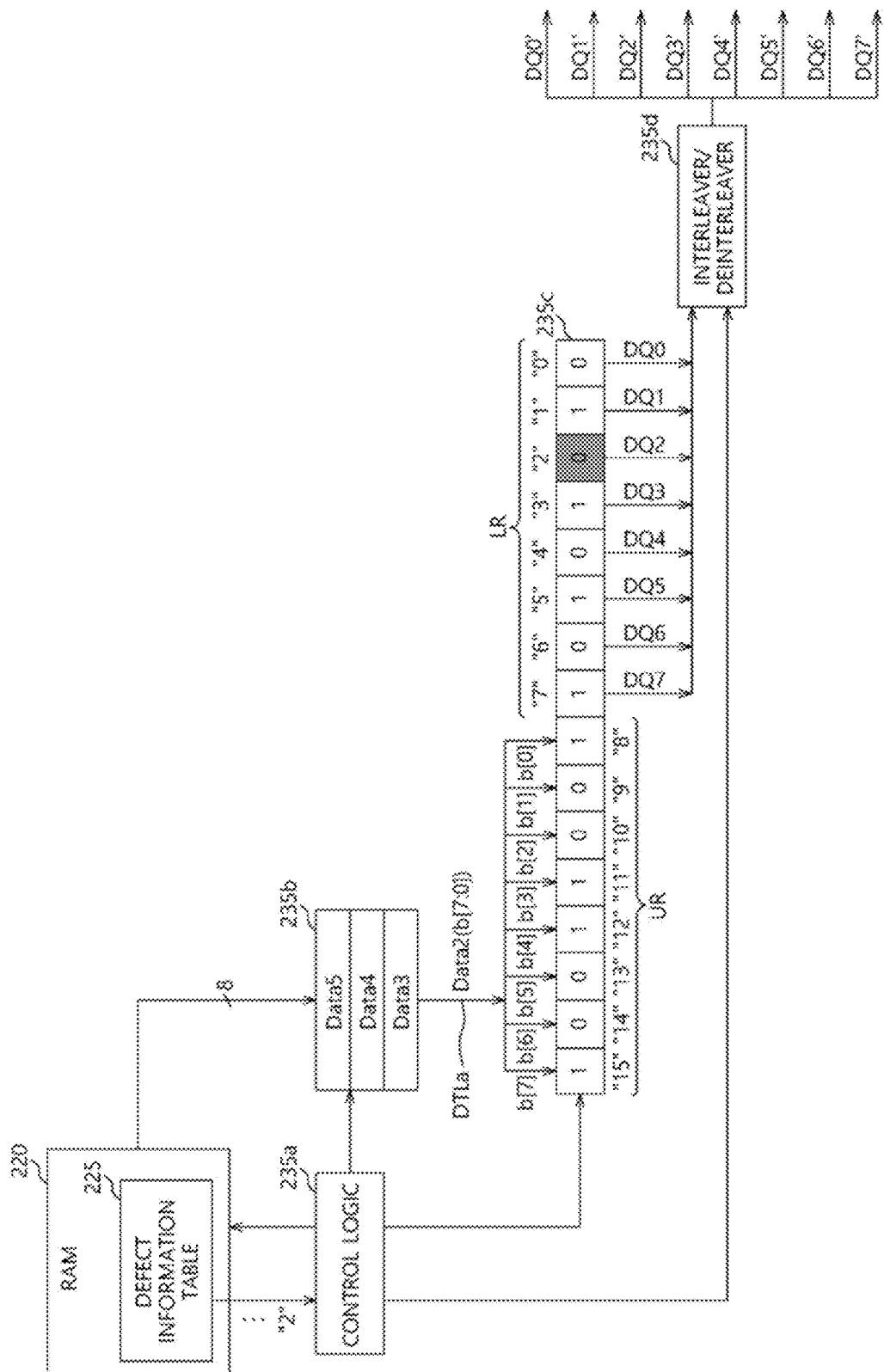

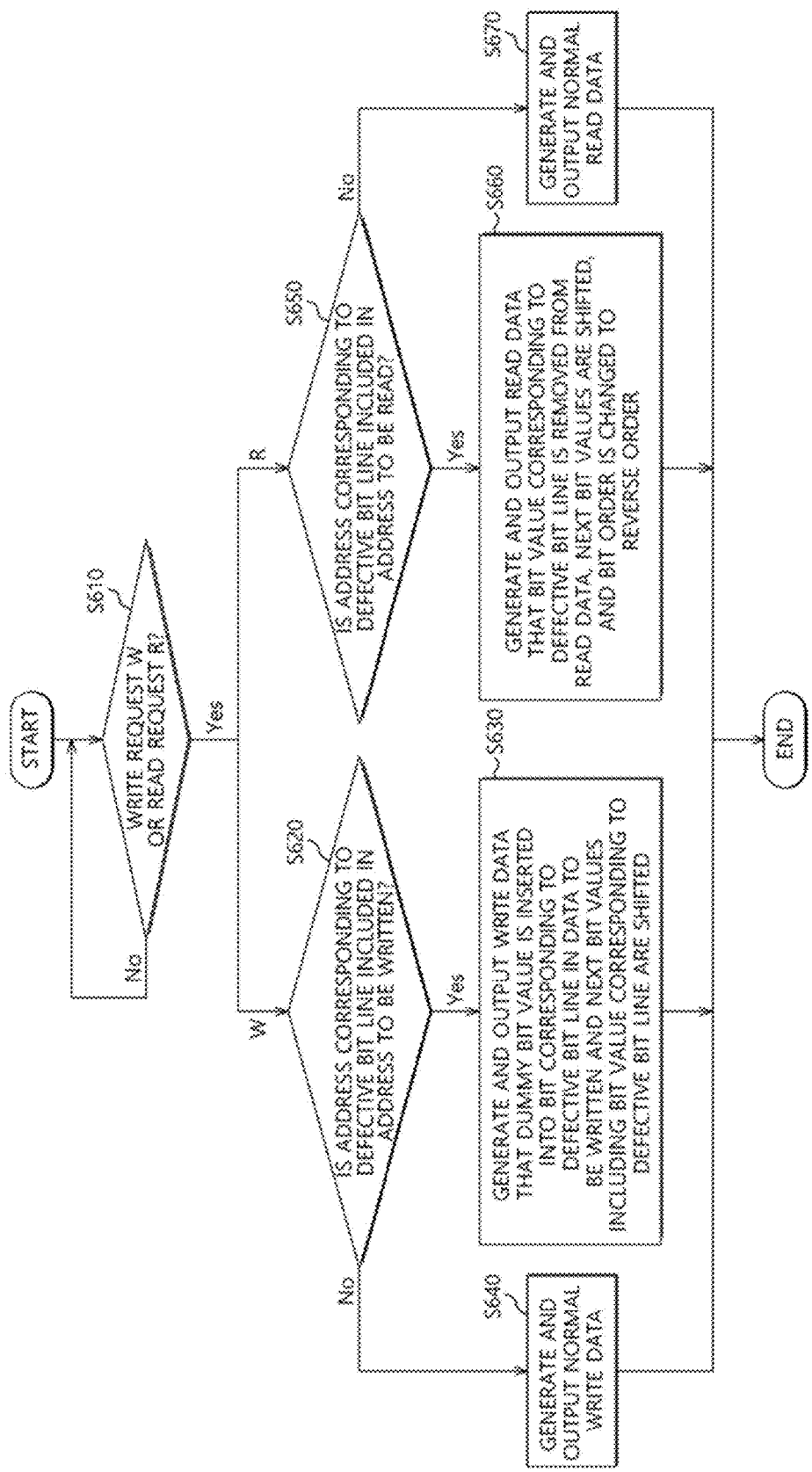

DATA STORAGE APPARATUS AND OPERATING METHOD THEREOF

CROSS-REFERENCES TO RELATED APPLICATION

The present application claims priority under 35 U.S.C. § 119(a) to Korean application number 10-2016-0160071, filed on Nov. 29, 2016, in the Korean Intellectual Property Office, which is incorporated herein by reference in its entirety.

BACKGROUND

1. Technical Field

Various embodiments may generally relate to semiconductor apparatus, and more particularly, to a data storage apparatus and an operating method thereof.

2. Related Art

In recent years, the paradigm for computer environments changed to ubiquitous computing which may use computer systems every time everywhere. As a result, use of portable electronic apparatuses such as a mobile phone, a digital camera and a laptop computer has been increasing rapidly. Generally, portable electronic apparatuses use data storage apparatuses that employ one or more memory devices for storing data. Data storage apparatuses may be used to store data used in the portable electronic apparatuses.

Data storage apparatuses using memory devices have no mechanical driving units and exhibit good stability and endurance, fast information access rate, and low power consumption. Such data storage apparatuses may include a universal serial bus (USB) memory device, a memory card having various interfaces, a universal flash storage (UFS) device, a solid state drive (SSD), and the like.

SUMMARY

Various embodiments of the present invention are directed to a data storage apparatus and an operating method thereof capable of increasing the number of permissible defective bit lines and an actually usable data region.

In an embodiment of the present disclosure, a data storage apparatus may include: a nonvolatile memory device; and a controller configured to determine whether or not one more addresses of defective bit lines are included in an address of a write data to be written into the nonvolatile memory device or an address of a read data read from the nonvolatile memory device, and write the write data or read the read data by skipping the defective bit lines based on a determination result.

In another embodiment of the present disclosure, a data storage apparatus may include: a nonvolatile memory device; and a controller configured to generate write data, in which dummy bit values are inserted into locations corresponding to the defective bit lines and next bit values are shifted, and transmit the write data to the nonvolatile memory device in a write operation and generate read data, in which the dummy bit values read from the defective bit lines are removed and next bit values are shifted, and transmit the read data to a host apparatus in a read operation.

In another embodiment of the present disclosure, an operation method of a data storage apparatus may include: determining whether or not addresses of defective bit lines are included in an address of write data to be written into the nonvolatile memory device or an address of read data read from the nonvolatile memory device; and generating write data, in which a dummy bit value is inserted into locations corresponding to the defective bit lines and next bit values are shifted, and transmitting the write data to the nonvolatile memory device, or generating read data, in which the dummy bit values read from the defective bit lines are removed and next bit values are shifted, and transmitting the read data to the host apparatus when the addresses of the defective bit lines are included in the address of the write data or the address of the read data.

According to the embodiments the data storage apparatus may perform a write operation or a read operation by skipping defective bit lines included in a nonvolatile memory device in bit units.

As the skip operation on the defective bit lines is performed in bit units, a separate redundancy region for replacing the defective bit lines and a circuit for replacing and managing the defective bit lines with redundancy bit lines may not be necessary in the nonvolatile memory device. Accordingly, an actual usable data region may be increased.

The number of permissible defective bit lines is considerably increased and the number of products discarded in mass production may be reduced. Accordingly, yield improvement and cost saving may be accomplished.

These and other features, aspects, and embodiments are described below in the section entitled "DETAILED DESCRIPTION"

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIGS. 4A to 4E are diagrams illustrating a defect skip write operation according to an embodiment of the present disclosure;

FIG. 6 is a flowchart illustrating an operation of a data storage apparatus according to an embodiment of the present disclosure;

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
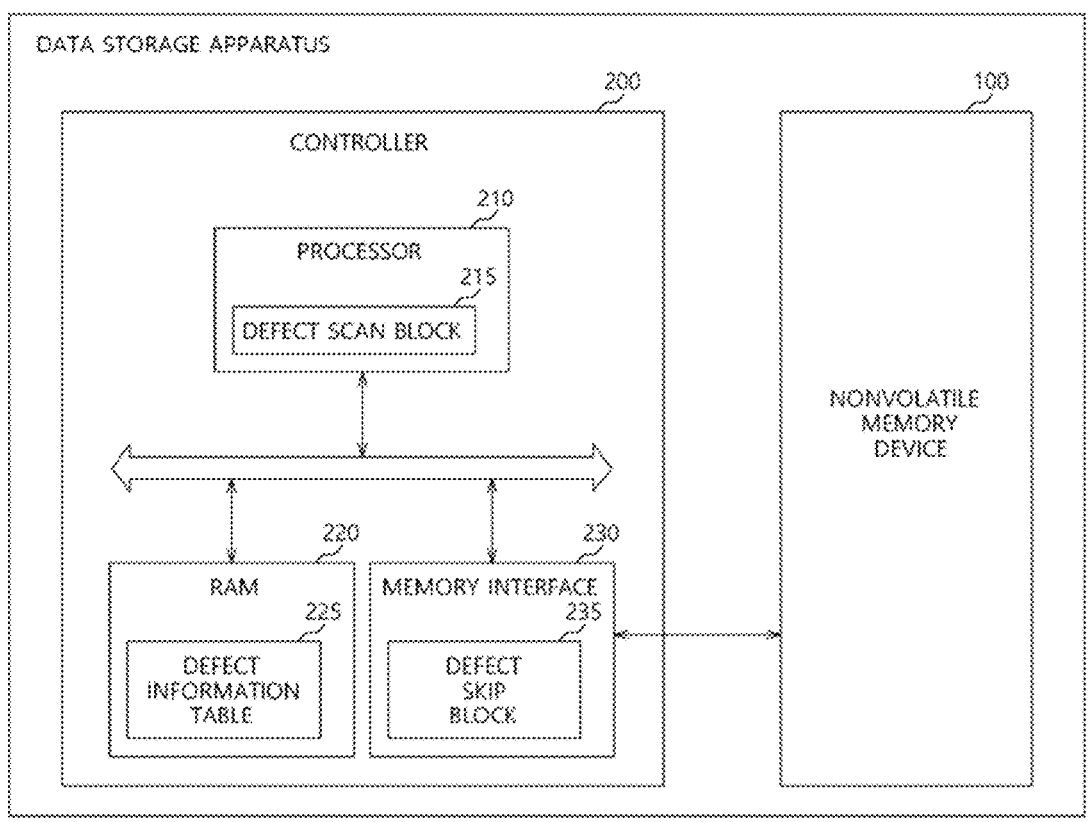
FIG. 1 is a block diagram illustrating a data storage apparatus according to an embodiment of the present disclosure.

FIG. 1 is a block diagram illustrating a data storage apparatus 10 according to an embodiment.

Referring to FIG. 1, the data storage apparatus 10 may store data to be accessed by a host apparatus (not shown) such as a mobile phone, an MP3 player, a laptop computer, a desktop computer, a game player, a television (TV), or an in-vehicle infotainment system, and the like. The data storage apparatus 10 may also be referred to as a memory system.

The data storage apparatus 10 may be manufactured as any one among various types of storage apparatuses according to a protocol of an interface coupled to the host apparatus. For example, the data storage apparatus 10 may be configured as any one of various types of storage apparatuses, such as a solid state drive (SSD), a multimedia card in the form of an MMC, an eMMC, an RS-MMC, and a micro-MMC, a secure digital card in the form of an SD, a mini-SD, and a micro-SD, a universal serial bus (USB) storage device, a universal flash storage (UFS) device, a personal computer memory card international association (PCMCIA) card type storage device, a peripheral component interconnection (PCI) card type storage device, a PCI-express (PCI-E) card type storage device, a compact flash (CF) card, a smart media card, and a memory stick, and the like.

The data storage apparatus 10 may be manufactured as any one among various types of packages. For example, the data storage apparatus 10 may be manufactured as any one of various types of packages, such as package on package (POP), system in package (SIP), system on chip (SOC), multi-chip package (MCP), chip on board (COB), wafer-level fabricated package (WFP), and wafer-level stack package (WSP).

The data storage apparatus 10 may include a nonvolatile memory device 100 and a controller 200.

The nonvolatile memory device 100 may be operated as a storage medium of the data storage apparatus 10. The nonvolatile memory device 100 may include any one of various types of nonvolatile memory devices, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase-change random access memory (PRAM) using a chalcogenide alloy, and a resistive random access memory (RERAM) using a transition metal compound.

It has been illustrated in FIG. 1 that the data storage apparatus 10 includes one nonvolatile memory device 100, but this is merely exemplary. It is therefore noted that the data storage apparatus 10 may include a plurality of nonvolatile memory devices coupled to a plurality of channels, and the embodiments described herein may be equally applied to a data storage apparatus including a plurality of nonvolatile memory devices.

Although not shown in FIG. 1, the nonvolatile memory device 100 may include a memory cell array having a plurality of memory cells arranged in rows and columns in regions in which a plurality of bit lines and a plurality of word lines cross to each other.

The controller 200 may include a processor 210, a random access memory (RAM) 220, and a memory interface 230. Although not shown in FIG. 1, the controller 200 may further include a host interface which transmits and receives a control signal, an address, data, and the like to and from a host apparatus (not shown).

The processor 210 may control an overall operation of the controller 200. The processor 210 may analyze and process a signal, a command, or a request received from the host apparatus. For example, when a read request and a logical block address (LBA) (hereinafter, referred to as logical address (LBA)) to be read are received from the host apparatus, the processor 210 may read data from the nonvolatile memory device 100 based on the received logical address (LBA). When a write request, a logical address (LBA) to be written, and data to be written are received from the host apparatus, the processor 210 may write the data in the nonvolatile memory device 100 based on the received logical address (LBA). In this example, the processor 210 may decode and drive firmware data loaded into the RAM 220. The processor 210 may be implemented with hardware or a combination of hardware and software.

The processor 210 may include a defect scan block 215. The defect scan block 215 may detect defective bit lines by scantling the nonvolatile memory device 100. For example, the defect scan block 215 may perform a test on bit lines included in the memory cell array of the nonvolatile memory device 100 and determine whether or not the bit lines are defective based on a test result.

In general, a test for determining whether or not the nonvolatile memory device is defective may be performed before the nonvolatile memory device 100 is packaged into the data storage apparatus When, according to the test result, the nonvolatile memory device is determined to be defective, the defective nonvolatile memory device may be discarded.

For the determination of whether or not the nonvolatile memory device is defective, a number of defective bit lines may be counted. The nonvolatile memory device may include a data region in which data is actually stored and a redundancy region including a redundancy bit line for replacing a defective bit line included in the data region. When the number of defective bit lines included in the nonvolatile memory device is larger than the number of redundancy bit lines (referred to as a size of the redundancy region), the nonvolatile memory device may be determined as defective. When the number of defective bit lines included in the nonvolatile memory device is smaller than the size of the redundancy region, the nonvolatile memory device may be determined as non-defective.

In the related art, heretofore, a defective bit line is replaced not bit-by-bit but byte-by-byte. For example, one defective bit line may not be replaced with one redundancy bit line but eight bit lines including the one defective bit line may be replaced with eight redundancy bit lines. Accordingly, when the number of defective bit lines is eight, the number of bit lines to be replaced is 64. Since 56 non-defective bit lines are also replaced, the size of the usable data region may be reduced and simultaneously the redundancy region may be wasted.

For example, when the size of the redundancy region is 96 bytes, the total number of redundancy bit lines included in the redundancy region is 768. When the number of defective bit lines is 97, the number of defective bit lines may be smaller than the number of redundancy bit lines (i.e., 97<768). However, as described above, since the defective bit line is replaced in byte units, a number of required redundancy bit lines is 776 and is larger than the number of the redundancy bit lines (i.e., 776>768). Accordingly, the defective bit lines may be determined to be irreplaceable and thus the nonvolatile memory device may be determined as defective.

As the size of a storage space in the nonvolatile memory device is increased and the total number of bit lines of the data region is also increased, a circuit for replacing and maintaining the defective bit line with the redundancy bit line in bit units may be considerably complicated. As the circuit structure is complicated, the probability that the defect occurs in the circuit may be increased and thus a conventional method for replacing and maintaining the defective bit lines in bit units may become practically unusable.

According to an embodiment of the present invention, a data storage apparatus is provided that may detect defective bit lines by scanning the memory cell array of the nonvolatile memory device 100, and then arrange the physical block addresses (PBAs) (hereinafter, referred to as physical addresses) of the detected defective lines in a table by sorting the physical addresses of the detected defective bit lines in an ascending order or in a descending order. The data storage apparatus 10 may then perform a write/read operation by skipping the defective bit lines by referencing the corresponding table. Accordingly, it is not necessary to divide the memory cell array of the nonvolatile memory device 100 into a data region and a redundancy region and it is not necessary to use a circuit configured to replace the defective bit lines with redundancy bit lines and manage the defective bit lines through mapping. In this manner, the number of permissible defective bit lines is considerably increased and the number of products discarded in mass production may be reduced. Accordingly, yield improvement and cost saving may be accomplished.

In an embodiment, the data storage apparatus may be set in a defective bit line detection mode for detecting the defective bit lines. The defective bit line detection mode may be a factory mode. Preferably, the processor 210 may set an operation mode of the data storage apparatus 10 to a factory mode before the data storage apparatus 10 operates to a normal mode. When the data storage apparatus is set to a defective bit line detection mode, the data storage apparatus may detect the defective bit lines by scanning the memory cell array of the nonvolatile memory device 100 through the defect scan block 215. Then the processor 210 may perform tabling of the detected defective bit lines by sorting physical addresses of the detected defective bit lines in an ascending order or in a descending order. The tabled defect information, for example, a defect information table may be error correction code (ECC) encoded through an ECC unit (not shown) in the controller 200 and the ECC encoded defect information table may be stored in the nonvolatile memory device 100. When the data storage apparatus 10 includes a plurality of nonvolatile memory devices, a plurality of defect information tables each corresponding to a different one of the nonvolatile memory devices may be generated through the above-described method. The plurality of defect information tables may be stored in at least one of the non-volatile memory devices. Preferably, the plurality of the defect information tables may be stored in corresponding nonvolatile memory devices. One or more defect information tables may correspond to each of the non-volatile memory devices.

Figure 2:
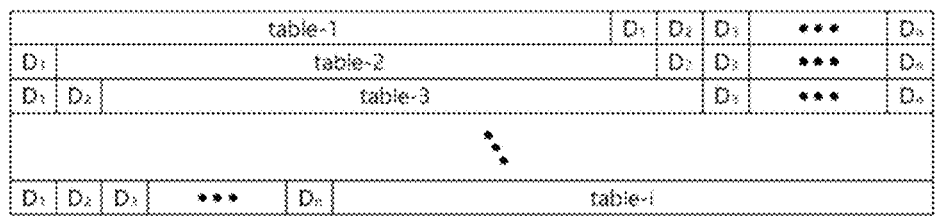
FIG. 2 is a diagram illustrating ECC encoded defect information tables stored in a nonvolatile memory device according to an embodiment of the present disclosure.

FIG. 2 is diagram illustrating exemplary ECC encoded defect information tables stored in the nonvolatile memory device 100 of FIG. 1.

When the data storage apparatus 10 enters a normal operational mode, the ECC encoded defect information tables stored in the nonvolatile memory devices 100 may be ECC decoded through the ECC unit and the ECC decoded defect information tables may be loaded into the RAM 220.

When the data storage apparatus 10 operates in response to a write/read request from a host apparatus, the data storage apparatus 10 may identify the defective bit lines by referencing the defect information tables loaded into the RAM 220. Hence, the errorless defect information tables which are loaded in the RAM 220 needs to be updated regularly so that it may represents an accurate listing of the defective bit lines.

The defective bit lines may be included in the memory cell array of the nonvolatile memory device 100 as described above and thus the defective bit lines may be included in a region in which the defect information table is stored. When the number of defective bit lines included in the region in which the defect information table is stored exceeds the error correction capacity of an ECC unit, an ECC decoding fail of the defect information table may be caused and thus the defect information table may not be used.

To prevent this problem, in an embodiment, a plurality of ECC encoded defect information tables which are shifted by one bit may be stored in the nonvolatile memory device 100. For example, as shown in FIG. 2, the processor 210 may store "i" number of ECC encoded defect information tables TABLE-1 to TABLE-I while shifting the "i" number of ECC encoded defect information tables by one bit. In this example, to equalize lengths of all the ECC encoded defect information tables table-1 to table-i, n dummy bits D1 to Dn may be added before and/or after each of the ECC encoded defect information tables.

The processor 210 may know the positions of the off-set information (for example start addresses and the like) of the ECC encoded defect information tables TABLE-1 to TABLE-I. When the data storage apparatus 10 enters a normal operational mode, the processor 210 may read the ECC encoded defect information tables TABLE-1 to TABLE-I from the known locations and perform ECC decoding operation on the read ECC encoded defect information tables through an ECC unit. When the normally ECC decoded defect information table is presented as a performing result, the processor 210 may control the corresponding defect information table to be loaded into the RAM 220.

The RAM 220 may store firmware data driven through the processor 210. The RAM 220 may also store system data required for driving the firmware data. For example, the RAM 220 may be operated as a working memory of the processor 210.

The RAM 220 may temporarily store data to be transmitted to the nonvolatile memory device 100 from a host apparatus or data to be transmitted to the host apparatus from the nonvolatile memory device 100. For example, the RAM 220 may be operated as a buffer memory.

The RAM 220 may include the defect information table 225 for the nonvolatile memory device 100. The defect information table 225 may be loaded from the nonvolatile memory device 100 into the RAM 220, for example, after the data storage apparatus 10 enters a normal operational mode. The physical addresses of the defective bit lines included in the nonvolatile memory device 100 may be stored in an ascending order (or a descending order) in the defect information table 225.

As described above, when the data storage apparatus 10 includes a plurality of nonvolatile memory devices 100, a plurality of defect information tables 225 respectively corresponding to the plurality of nonvolatile memory devices 100 may be loaded into the RAM 220.

The memory interface 230 may be configured to transmit and receive a control signal, an address signal, a data signal, and the like to and from the nonvolatile memory device 100. The memory interface 230 may include a defect skip block 235. In the embodiment of FIG. 1, the defect skip block 235 is included in the memory interface 230, but the invention is not limited in this way. For example, in another embodiment, the defect skip block 235 may be disposed outside of the memory interface 230.

When an access request and a logical address to be accessed are received from a host apparatus the processor 210 may convert the logical address to a physical address corresponding thereto with reference to an address mapping table (not shown).

The defect skip block 235 may perform a skip operation to the physical address converted through the processor 210 with reference to the defect information table 225 laded into the RAM 220, that is, the physical address included in the defect information table in the physical address to be accessed and to access next physical address. Here, during the skip operation, a dummy bit value may be written into a defective bit line or a bit value written in the defective bit line may be removed.

Figure 3:
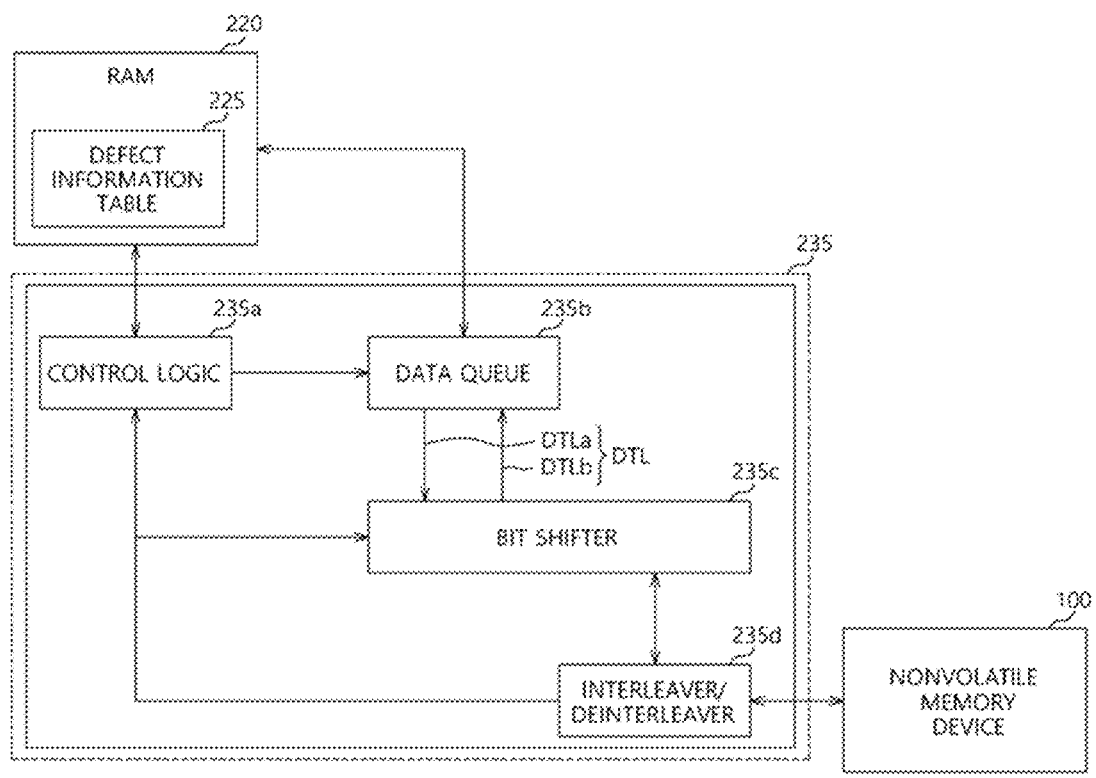
FIG. 3 is a diagram illustrating an exemplary configuration of a defect skip block of FIG. 1.

FIG. 3 is a diagram illustrating an exemplary configuration of the defect skip block 235 of FIG. 1.

Referring to FIG. 3, the defect skip block 235 may include a control logic 235a a data queue 235b, a bit shifter 235c, and an interleaver/deinterleaver 235d.

The control logic 235a may control an overall operation of the defect skip block 235.

The data queue 235b may queue pieces of write data transmitted from a host apparatus through the RAM 220 when a write request is received from the host apparatus. Further, the data queue 235b may queue pieces of read data read from the nonvolatile memory device 100 according to a read request from the host apparatus. For example, the data queue 235b may queue data on the first-in-first-out (FIFO) basis.

The bit shifter 235c may shift data provided from the data queue 235b in bit units and output the shifted data to the interleaver/deinterleaver 235d. Further, the bit shifter 235c may shift data provided from the interleaver/deinterleaver 235d in bit units and output the shifted data to the data queue 235b.

For example, as illustrated in FIG. 4A, the bit shifter 235c may include a plurality of bit storage regions. A part of the bit storage regions may be coupled to the data queue 235b and the remaining part of the bit storage regions may be coupled to the interleaver/deinterleaver 235d. Hereinafter, for clarity, a plurality of bit storage regions coupled to the data queue 235b may refer to an upper region UR and a plurality of bit storage regions coupled to the interleaver/deinterleaver 235d may refer to a lower region LR.

The upper region UR may store data provided from the data queue 235b or output stored data to the data queue 235b. The lower region LR may store data provided from the interleaver/deinterleaver 235d or output stored data to the interleaver/deinterleaver 235d. A data transmission line DTL between the upper region UR of the bit shifter 235c and the data queue 235b may include a first data transmission line DTLa configured to transfer the data from the data queue 235b to the upper region UR of the bit shifter 235c and a second data transmission line DTLb configured to transfer the data from the upper region UR of the bit shifter 235c to the data queue 235b.

The data stored in the upper region UR may be shifted to the lower region LR in bit units and the data stored in the lower region LR may be shifted to the upper region UR in bit units.

The interleaver/deinterleaver 235d may perform an interleaving operation on the data output from the bit shifter 235c in bit units and output the interleaved data to the nonvolatile memory device 100 or may perform a deinterleaving operation on the data read from the nonvolatile memory device 100 in bit units and output the deinterleaved data to the bit shifter 235c. During the interleaving operation, a dummy bit may be inserted into a location corresponding to a defective bit line among bits of data to be written and bits of a MSB side including the bit originally located on the location of the dummy bit may be shifted by one bit to an upper bit direction. During the deinterleaving operation, the dummy bit corresponding to a defective bit line among bits of read data may be removed, the bits of the MSB side with reference to the dummy bit may be shifted by one bit to a lower bit direction, and changes a bit order of the read data to a reverse order. The interleaving/deinterleaving operation will be described below in detail with reference to FIGS. 4A to 5E.

FIGS. 4A to 4E are diagrams illustrating a defect skip write operation according to an embodiment. Here, the reference numerals "0 to 15" may refer to physical addresses of bit lines and "b[0] to b[7]" may refer to bit numbers of data. For example, "b[0]" may refer to the least significant bit (LSB) of the data and "b[7]" may refer to the most significant bit (MSB) of the data. The reference numbers "Data 1" and "Data 2" may be original data output from the data queue 235b and "Data 1'" and "Data 2'"" may be interleaved data output from the interleaver/deinterleaver 235d. The reference numerals "DQ0 to DQ7" may be bits of the original data and "DQ0' to DQ7'" may be bits of the interleaved data.

First, when a write request, a logical address (LBA), and write data are transmitted from a host apparatus the processor 210 may generate a corresponding control signal based on the received write request, convert the received logical address (LBA) to a physical address (PBA) corresponding thereto, and transmit the generated control signal and the converted physical address (PBA) to the memory interface 230. The write data may be temporarily stored in the RANI 220.

Referring to FIG. 4A, the RAM 220 may output the temporarily stored write data in response to the control signal provided from the control logic 235a. The write data may be output in eight-bit units, but this is not limited thereto. Hereinafter, for clarity, the input and output of the write data and the read data may be performed in eight-bit units.

The 8-bit write data b[7:0] output from the RAM 220 may be sequentially queued in the data queue 235b and the queued write data b[7:0] may be sequentially output to the bit shifter 235c from first data Data 1 firstly queued according to the FIFO basis.

FIG. 4A illustrates an example that a plurality of write data Data 1 to Data 4 are output from the RAM 220 and queued in the data queue 235b and the first write data Data 1 of 8-bit b[7:0] is output from the data queue 235b and stored in the upper region UR of the bit shifter 235c.

Figure 4B:
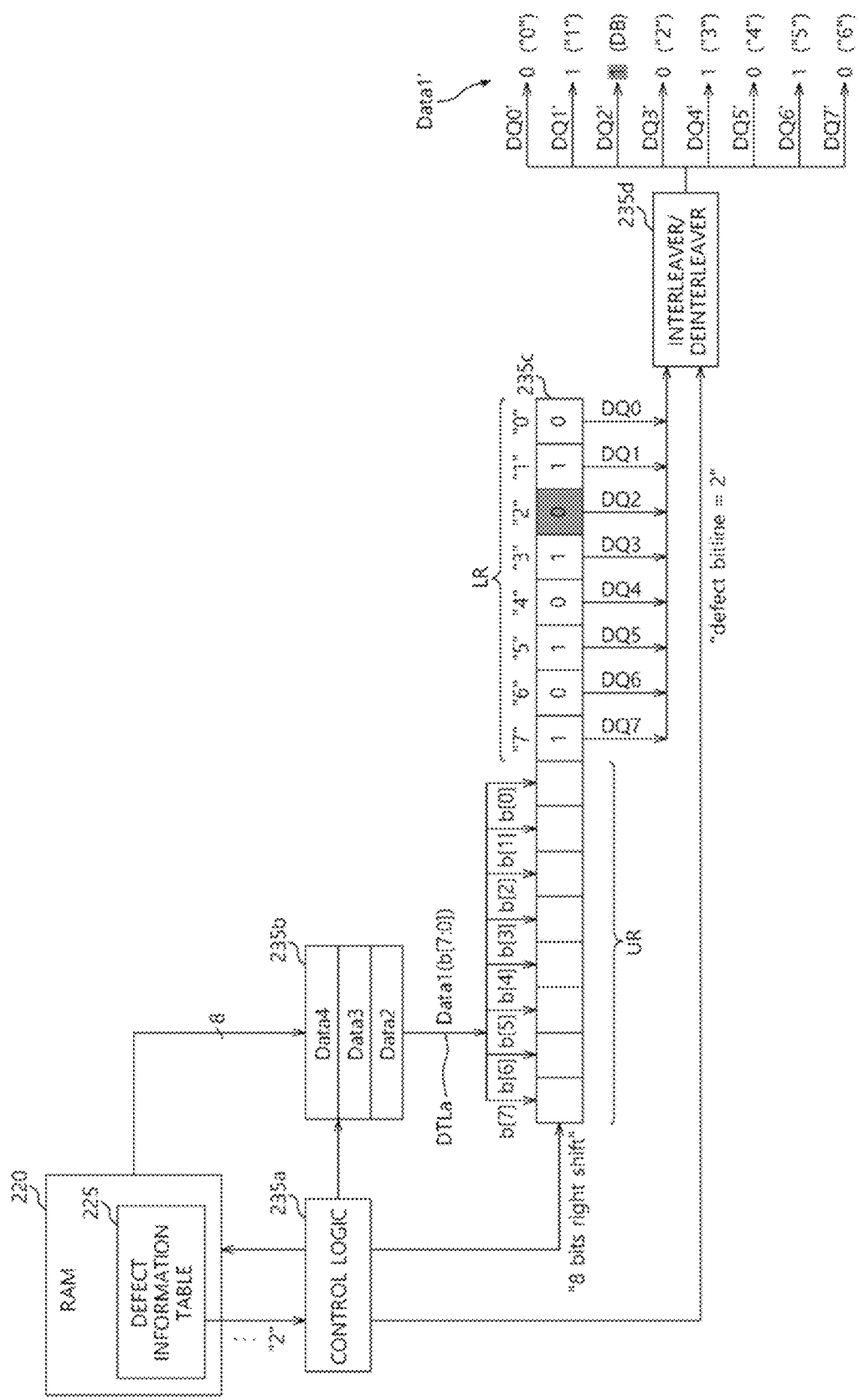

Referring to FIG. 4B, the control logic 235a may transmit to the bit shifter 235c a control signal "8 BITS RIGHT SHIFT" which controls the first write data Data 1 stored in the upper region UR to be shifted by eight bits to the right. The bit shifter 235c may shift the first write data Data 1 by eight bits to the right in response to the control signal "8 BITS RIGHT SHIFT". Accordingly, the first write data Data 1 may be shifted into the lower region LR.

The bit shifter 235c may transmit the first write data Data 1 stored in the lower region LR to the interleaver/deinterleaver 235d through the control of the control logic 235a. The control logic 235a may determine whether or not an address corresponding to a defective bit line is included in the physical address of the first write data Data 1 with reference to the defect information table 225. FIG. 4A illustrates that an address "2" is a physical address of the defective bit line.

The control logic 235a may provide the interleaver/deinterleaver 235d with a control signal "DEFECT BITLINE=2" indicating that the physical address of the defective bit line is "2". The interleaver/deinterleaver 235d may output a dummy bit value "1" to the defective bit line corresponding to the address "2" in response to the control signal "DEFECT BITLINE=2". A bit value "0" to be outputted to the defective bit line corresponding to the address "2" may be shifted by one bit and may be outputted to the next bit line i.e., a bit line of an address "3". The dummy bit value may be "1" as illustrated in FIG. 4A, but this is not limited thereto.

As the bit value "0" to be outputted to the defective bit line which is the address "2" is shifted by one bit and is now outputted to the next bit line having an address "3", the other bit values respectively to be outputted to bit lines which are addresses "3 to 6" may also be shifted by one bit and may be outputted to bit lines having addresses "4 to 7". Accordingly, a bit value which was to be outputted to the bit line having the address "7" may now not be outputted. For example, the first data Data 1' interleaved in and output from interleaver/deinterleaver 235d may now include one dummy bit. DQ2' and may not include the original MSB DQ7 having a value of "1".

Referring to FIG. 4C, the data queue 235b may output the second write data Data 2 of 8-bit b[7:0] and the output second write data Data 2 may be stored in the upper region UR of the bit shifter 235c.

Figure 4D:
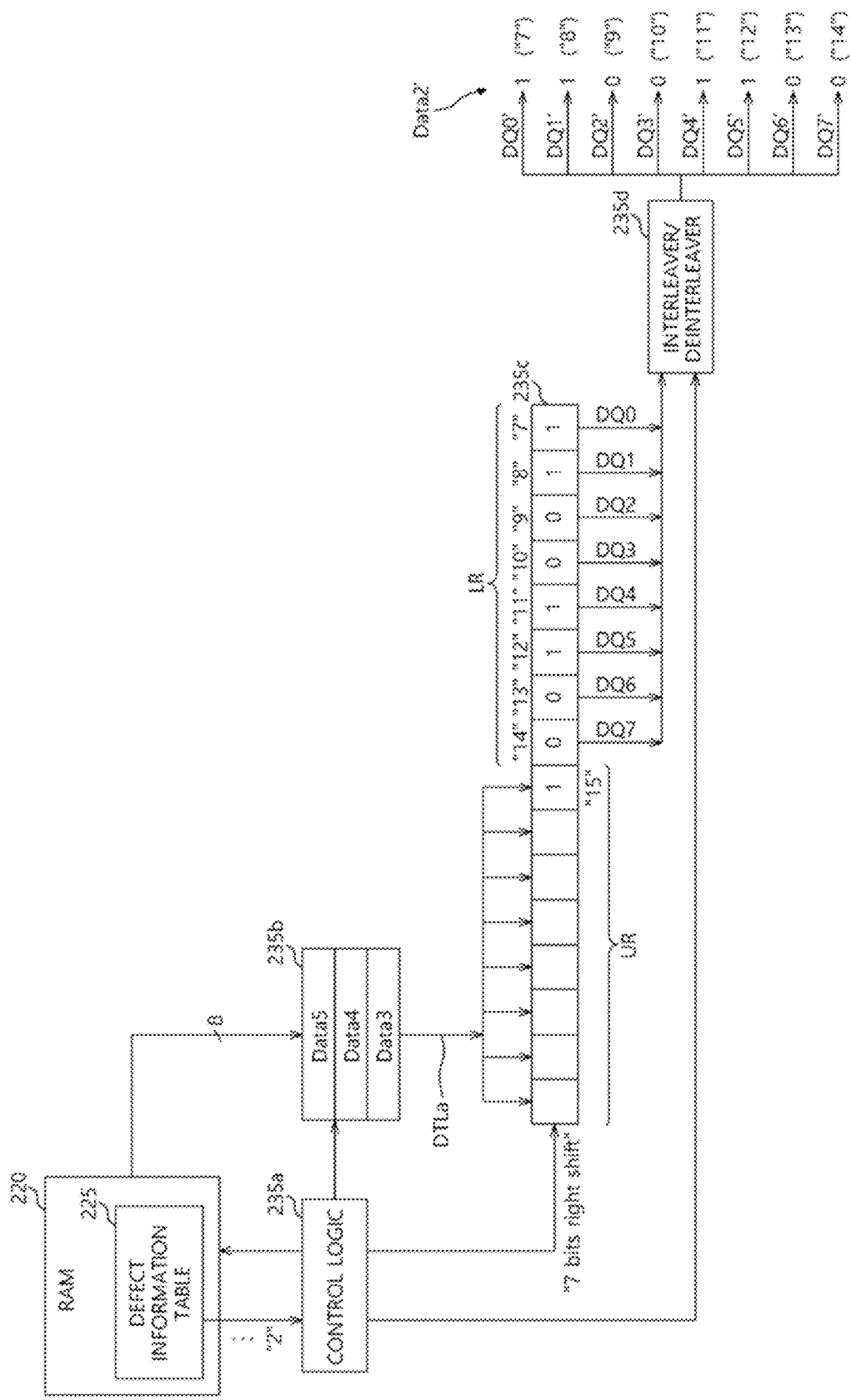

Referring to FIG. 4D, the control logic 235a may transmit to the bit shifter 235c a control signal "7 BITS RIGHT SHIFT" which controls the second write data Data 2 stored in the upper region UR to be shifted by seven bits to the right in response to the control signal "7 BITS RIGHT SHIFT".

In the embodiment, the control logic 235a may control the bit shifter 235c to shift remaining data (e.g., the second to fourth write data Data 2 to Data 4) other than an initial data (e.g., the first write Data 1) to right by 8 bits minus a number of defective bit lines, which are to output previous data (e.g., the first rite data Data 1 in FIG. 4D), in order to output remaining bits of the previous data, which was not outputted due to the bit-insert and bit-shift for the defective bit lines of the previous data (e.g., the original MSB DQ7 of the first write Data 1 in FIG. 4C).

For example, as illustrated in FIG. 4B, since one defective bit line (the bit line of the address "2") is included in 8 bit lines which are to output the first data Data 1, the control logic 235a may transmit to the bit shift 235c the control signal "7 BITS RIGHT SHIFT" which controls the bit values of the data (for example, the second write data Data 2) to be shifted by seven bits (i.e., 8 bits minus 1 bit representing a number of defective bit lines to output the previous data, which is the first write data Data 1) to the right, and the bit shifter 235c may shift the bit values of the second write data Data 2 by seven bits to right in response to the control signal "7 BITS RIGHT SHIFT". Accordingly, the bit value "1" of the original MSB DQ7 of the first write data Data 1 and bit values corresponding to addresses "8 to 14" of the second write data Data 2 may be shifted into the lower region LR. A bit value "1" of the original MSB corresponding to an address "15" of the second write data Data 2 may be shifted but may stay in the upper region UR.

The bit shifter 235c may output the bit values corresponding to the addresses "7 to 14" stored in the lower region LR to the interleaver/deinterleaver 235d. When an address corresponding to a defective bit line is not included in the addresses "8 to 14", the interleaver/deinterleaver 235d may output the data received from the bit shifter 235c as it is, as illustrated in FIG. 4D.

Figure 4E:
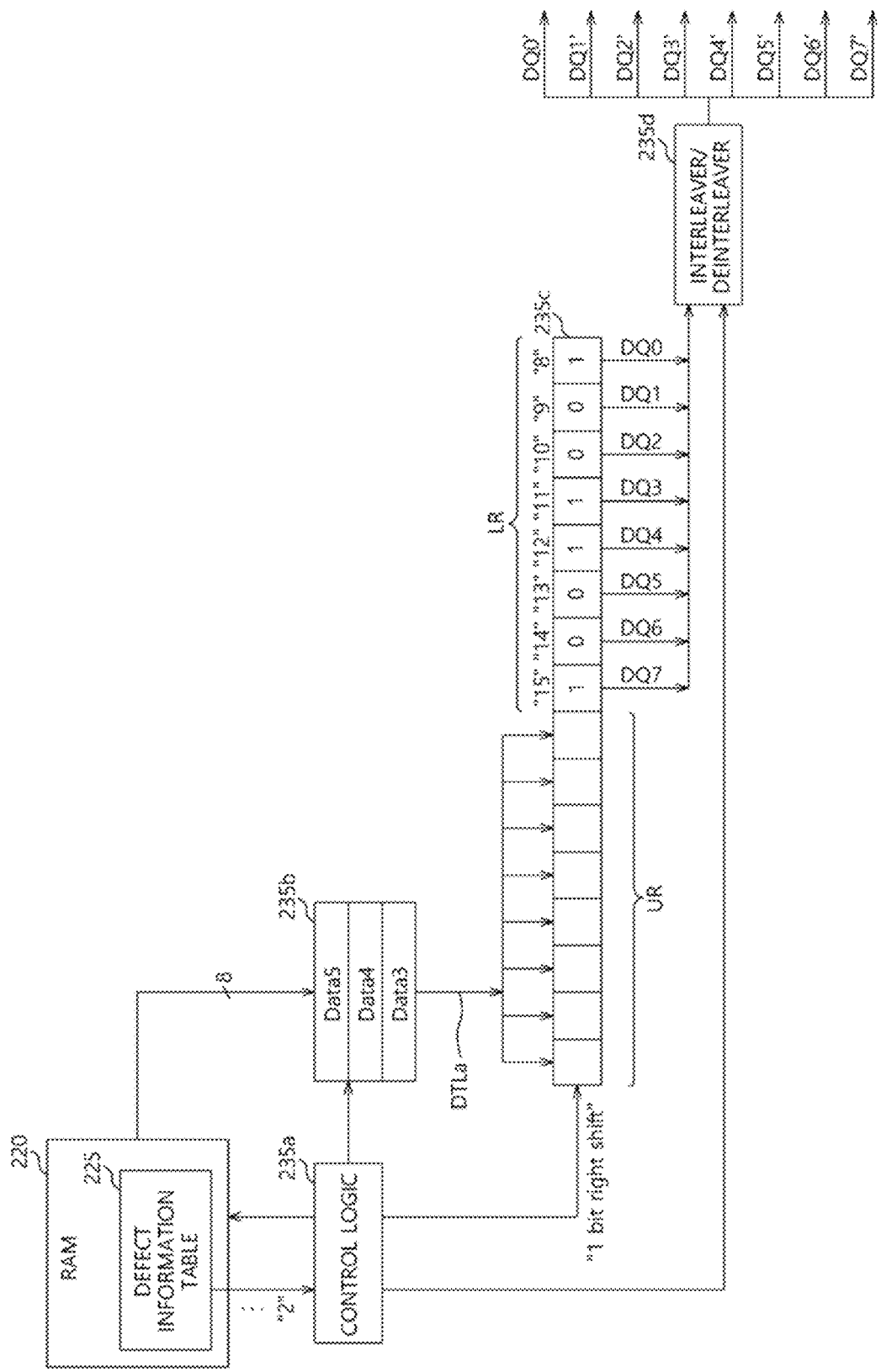

Referring to FIG. 4E, the control logic 235a may transmit to the bit shifter 235c a control signal "1 BIT RIGHT SHIFT" which controls bit values of the write data remained in the bit shifter 235c to be shifted by one bit to right, and the bit shifter 235c may additionally shift the second write data Data 2, which is remained in the bit shifter 235c, by one bit to right in response to the control signal "1 BIT RIGHT SHIFT". The amount of the additional shift may correspond to a number of defective bit lines, which are to output previous data (e.g., the first write data Data 1 in FIG. 4D). Accordingly, whole bit values of the current write data (i.e., the second write data Data 2) corresponding to the addresses "8 to 15" may be stored in the lower region LR of the bit shifter 235c. The upper region UR may be empty and whole bit values of subsequent write data (i.e., the third write data Data 3) output from the data queue 235b may be stored in the upper region D. The control logic 235a may control the bit shifter 235c to shift the bit values of the subsequent write data (i.e., the third write data Data 3) by seven bits (i.e., 8 bits minus 1 bit representing a number of defective bit lines to output the previous data, which is the first write data Data 1 and the second write data Data 2) to right.

FIGS. 5A to 5E are diagrams illustrating a defect skip read operation according to an embodiment. Here, the reference numerals "0 to 15" may refer to physical addresses of bit lines and "b[0] to b[7]" may refer to bit numbers of data. The reference numbers "Data 1''' and "Data 2'''" may be data read from the nonvolatile memory device 100 and "Data 1''''" and "Data 2''''" may be deinterleaved data output from the interleaver/deinterleaver 235d. The reference numerals "DQ0' to DQ7'" may be bits of the interleaved data and "DQ0'' to DQ7''''" may be bits of the deinterleaved data, Referring to FIG. 5A, the first read data Data 1' read from the nonvolatile memory device 100 in response to the read request of a host apparatus may be provided to the interleaver/deinterleaver 235d. The control logic 235a may provide to the interleaver/deinterleaver 235d the control signal "DEFECT BITLINE=2" indicating that the physical address of the defective bit line is "2" The interleaver/deinterleaver 235d may remove the dummy bit value output from the defective bit line corresponding to the address "2" among bit values of the first read data Data 1' in response to the control signal "DEFECT BITLINE=2", and shift bit values output from bit lines corresponding to next addresses (that is the addresses "3 to 6") by one bit to a lower bit direction. The interleaver/deinterleaver 235d may output the shifted first read data Data 1' to the bit shifter 235c by changing the bit order of the first data Data 1' to a reverse order.

Figure 5A:
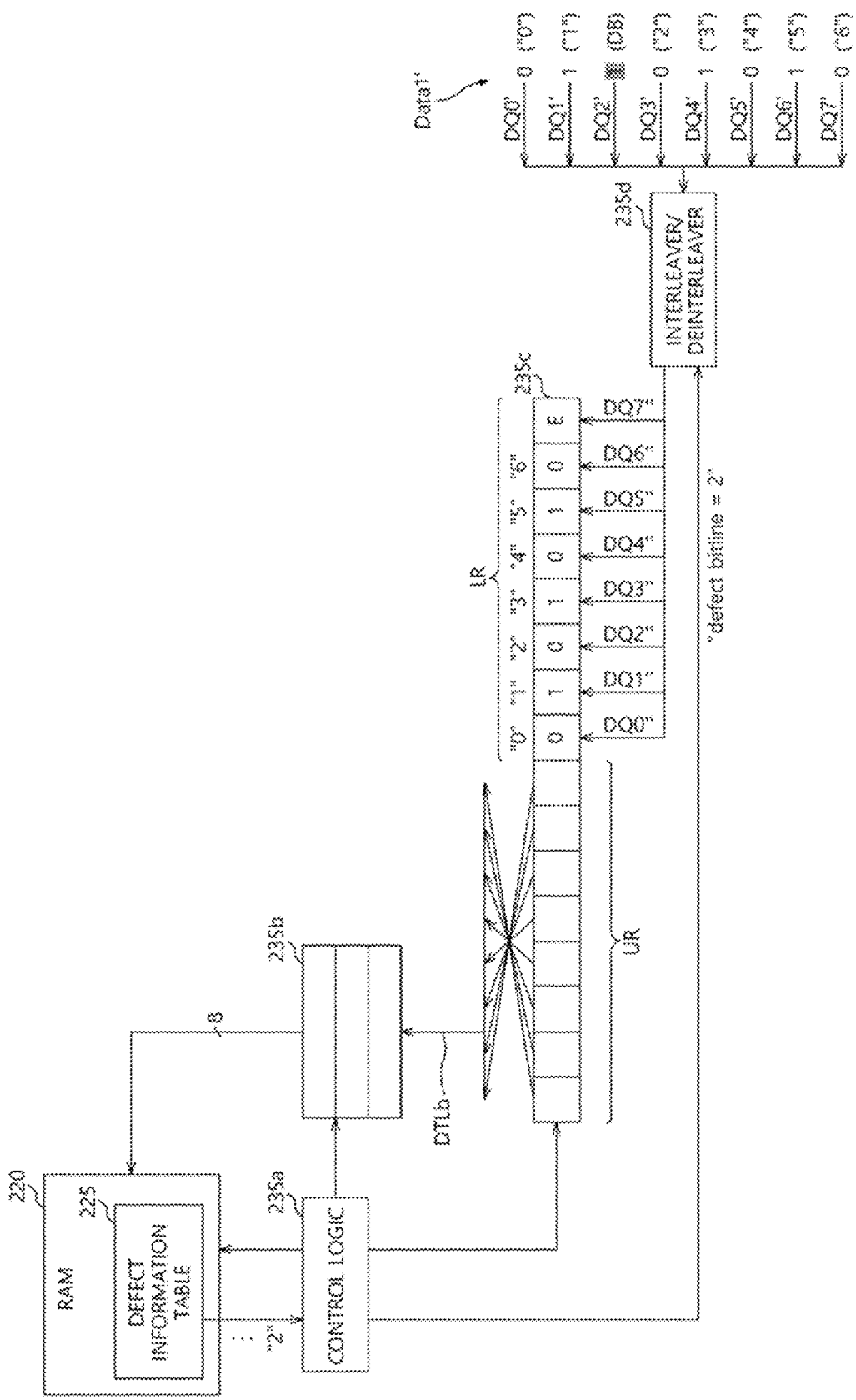
FIGS. 5A to 5E are diagrams illustrating a defect skip read operation according to an embodiment of the present disclosure.

Accordingly, as illustrated in FIG. 5A, a bit value corresponding to an address "0" of the first read data Data 1" output from the interleaver/deinterleaver 235d may be stored in the MSB of the lower region LR of the bit shifter 235c and the LSB of the lower region LR of the bit shifter 235c may be an empty state E.

Figure 5B:
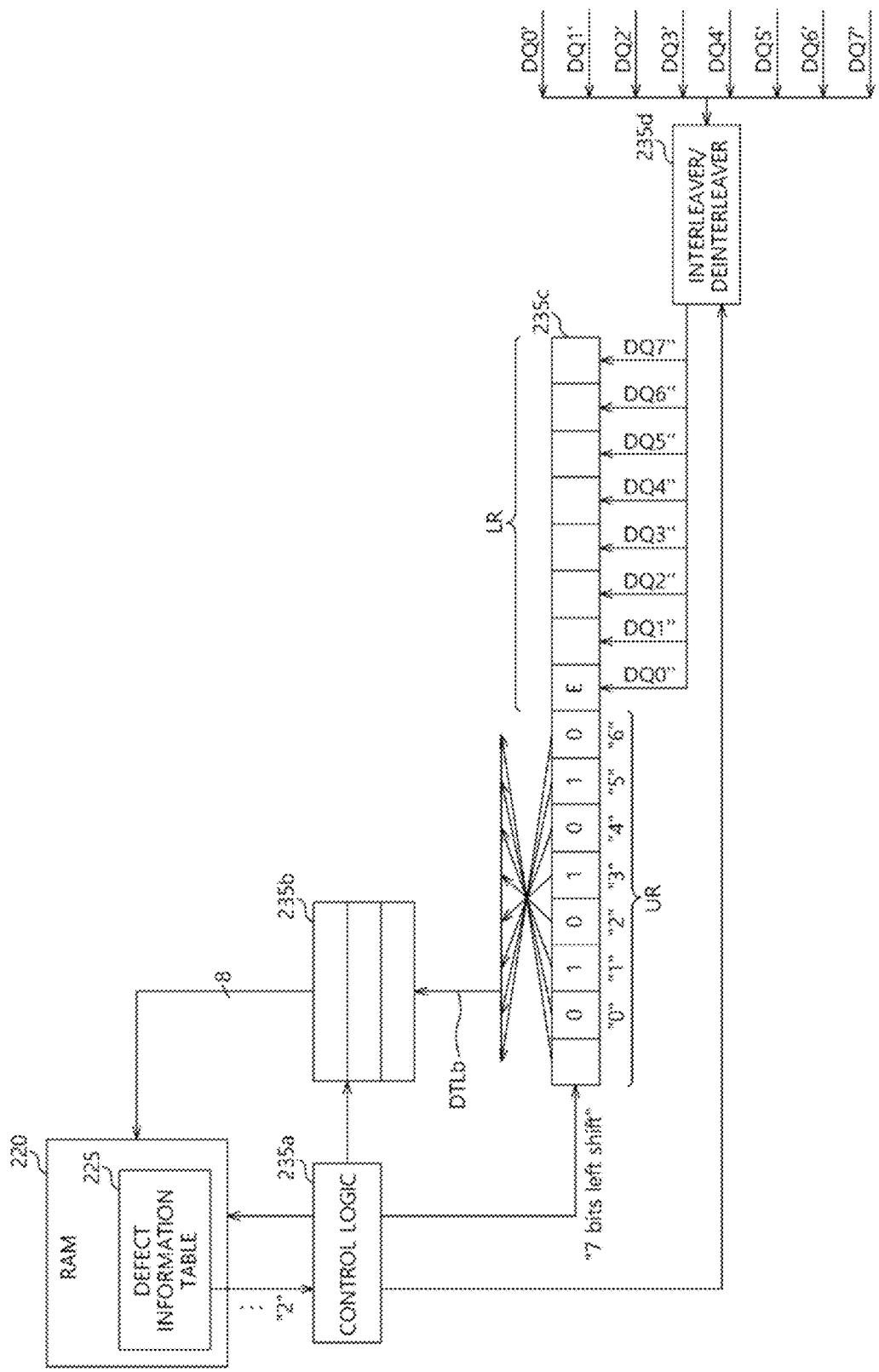

Referring to FIG. 5B, the control logic 235a may transmit to the bit shifter 235c a control signal "7 BITS LEFT SHIFT" which controls bit values of data stored in the lower region LR of the bit shifter 235c to be shifted by seven bits, which correspond to 8 bits minus a number of bits in the empty state E in the currently deinterleaved read data (e.g., the deinterleaved first read data Data 1") or a number of defective bit lines for the currently read data (e.g., the first read data Data 1'), to left, in order to restore the original data (e.g., the first write data Data 1) from the currently deinterleaved read data (e.g., the deinterleaved first read data Data 1") by inserting one or more bit values (e.g., the bit value "1" of MSB DQ7) now included in a subsequently read data (e.g., the second read data Data 2') but supposed to be included in the currently deinterleaved read data (e.g., the deinterleaved first read data Data 1"). The number of bits in the empty state E in the currently deinterleaved read data (e.g., the deinterleaved first read data Data 1") may correspond to a number of bit values (e.g., the single bit value of MSB DQ7) now included in a subsequently read data (e.g., the second read data Data 2') but supposed to be included in the currently deinterleaved read data (e.g., the deinterleaved first read data Data 1").

The bit shifter 235c may shift the first data Data 1" by seven bits to left in response to the control signal "7 BITS LEFT SHIFT". Accordingly, the 7 bit values corresponding to the addresses "0 to 6" of the deinterleaved first read data Data 1" may be stored in the upper region UR.

Figure 5C:
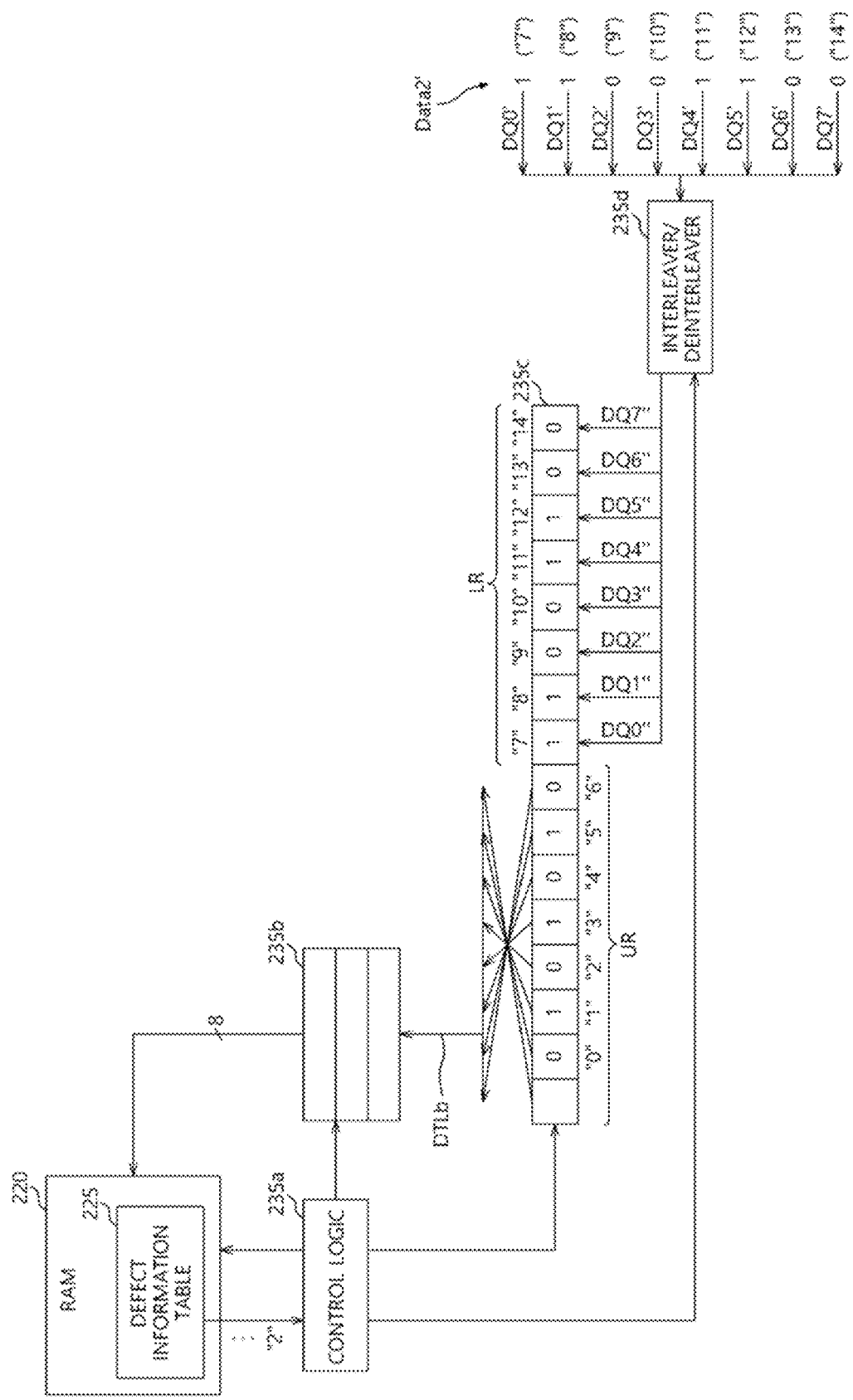

Referring to FIG. 5C, the second read data Data 2' read from the nonvolatile memory device 100 may be provided to the lower region LR of the interleaver/deinterleaver 235d. Since an address corresponding to the defective bit line is not included in the addresses "7 to 14", the interleaver/deinterleaver 235d may output the second read data Data 2' received from to the bit shifter 235c only by changing a bit order of the second read data Data 2' to a reverse order. Accordingly, the bit value corresponding to the address of the deinterleaved second read data Data 2" may be stored in the MSB of the lower region LR of the bit shifter 235c and a bit value corresponding to an address "14" of the second data Data 2" may be stored in the LSB of the lower region LR of the bit shifter 235c.

Figure 5D:
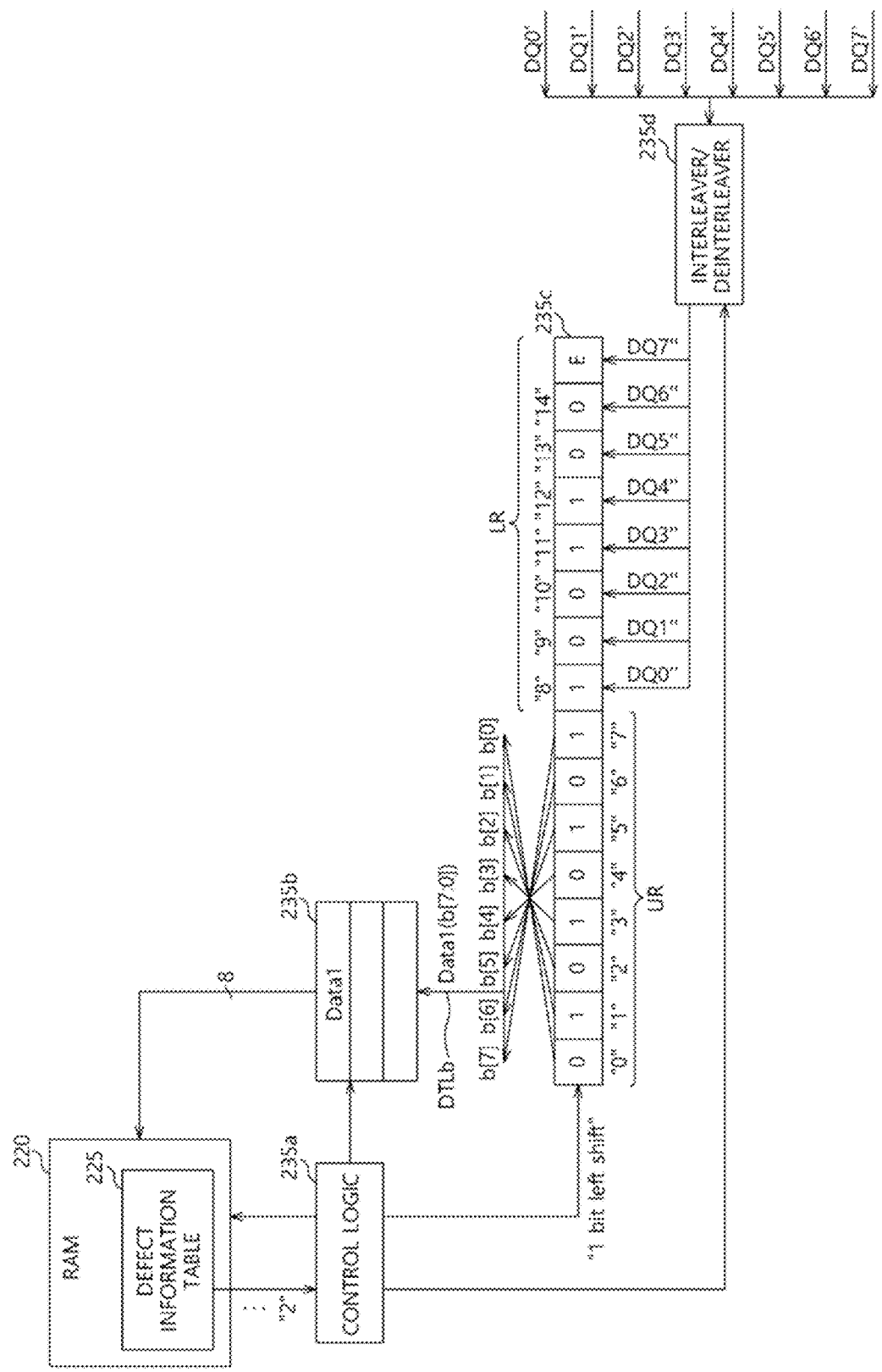

Referring to FIG. 5D, the control logic 235a may transmit to the bit shifter 235c a control signal "1 BIT LEFT SHIFT" which controls bit values of data stored in the bit shifter 235c to be shifted by one bit to left. The bit shifter 235c may additionally shift the bit values of the deinterleaved second read data Data 2" by one bit to left in response to the control signal "1 BIT LEFT SHIFT". The amount of the addition& shift may correspond to a number of bits in the empty state E in the previously deinterleaved read data (e.g., the deinterleaved first read data Data 1" in FIG. 5A). Accordingly, the whole bit values of the previously deinterleaved read data (i.e., the deinterleaved first read data Data 1") corresponding to the addresses "0 to 7" of the previously deinterleaved read data may be stored in the upper region UR of the bit shifter 235c. The bit order of the first data Data 1" may be in a reverse order as it is.

The bit shifter 235c may output the deinterleaved first read data Data 1" stored in the upper region UR to the data queue 235b through the control of the control logic 235a. The deinterleaved first read data Data 1" may be transmitted to the data queue 235b through the second data transmission line DTLb. The second data line DTLb may be configured to transmit the deinterleaved first read data Data 1" to the data queue 235b by changing a bit order of the deinterleaved first read data Data 1" which is in a reverse order to an original order. For example, the second data transmission line DTLb may be configured to transmit the deinterleaved first read data to the data queue 235b in such a manner that a 0-th bit value and a seventh bit value of the upper region UR of the bit shifter 235c may be swapped, a first bit value and a sixth bit value may be swapped, a second bit value and a fifth bit value may be swapped, and a third bit value and a fourth bit value may be swapped.

Figure 5E:
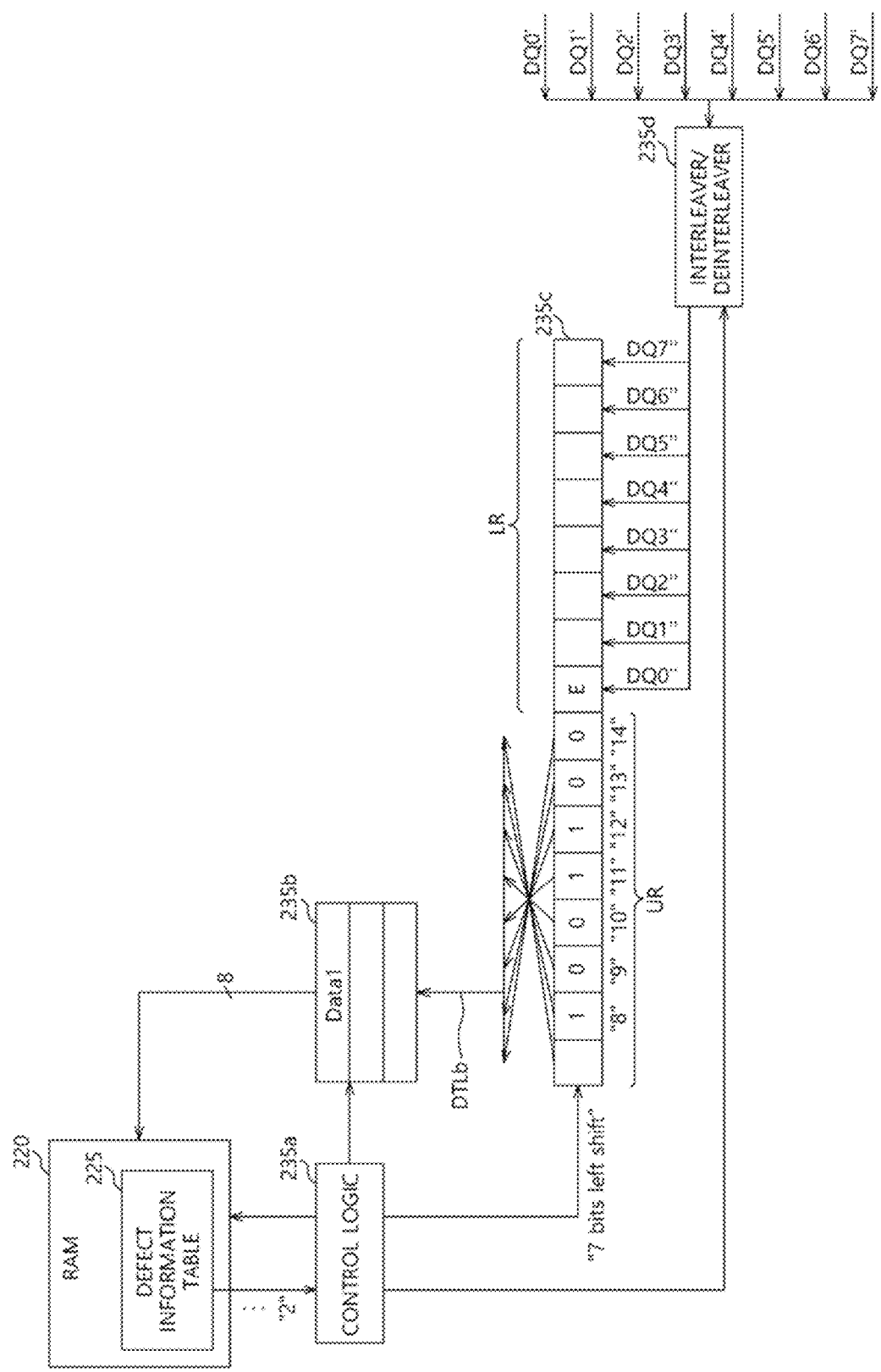

Referring to FIG. 5E the control logic 235a may transmit to the bit shifter 235c the control signal "7 BITS LEFT SHIFT" which controls bit values of data stored in the lower region LR of the bit shifter 235c to be shifted by seven bits to left. The bit shifter 235c may shift the bit values of the deinterleaved read data stored therein by seven bits to left. Accordingly, the bit values corresponding to the addresses "8 to 14" may be stored in the upper region UR of the bit shifter 235c. The lower region LR may be an empty and thus data (i.e., a deinterleaved third read data) read in next order may be stored in the lower region. The control logic 235a may control the bit shifter 235c to shift the whole bit values of the deinterleaved two read data and the deinterleaved third read data by one bit to left.

FIG. 6 is a flowchart illustrating an operation of a data storage apparatus according to an embodiment. The operation method of a data storage apparatus according to an embodiment will be described below with reference to FIGS. 1, 3, 4A to 5E and 6.

In operation S610, the processor 210 of the controller 200 may determine whether a write request or a read request is received from a host apparatus (not shown). When the write request W is received from the host apparatus as a determination result, an operation S620 may proceed.

In operation S620, the defect skip block 235 of the controller 200 may determine whether or not an address corresponding to a defective bit line is included in an address of a write data to be written with reference to the defect information table 225 loaded into the RAM 220. The address of the write data to be written may refer to a physical address converted through the processor 210 based on a logical address transmitted from the host apparatus.

When the address corresponding to the defective bit line is included in the address of the write data to be written as a determination result, the defect skip block may proceed to operation S630. When the address corresponding to the defective bit line is not included in the address of the write data to be written as the determination result, the defect skip block may proceed to operation S640.

In operation S630, the defect skip block 235 may generate write data, in which a dummy bit value is inserted into a location corresponding to the defective bit line and bits of a MSB side with reference to the dummy bit including the bit originally located on the location of the dummy bit is shifted by one bit to an upper bit direction, and output the generated write data to the nonvolatile memory device 100.

In operation S640, the defect skip block 235 may generate normal write data having the same bit values as the data to be written and output the generated normal write data to the nonvolatile memory device 100.

When the read request R is received from the host apparatus, an operation S650 may proceed.

In operation S650, the defect skip block 235 may determine whether or not the address corresponding to the defective bit line is included in an address of a read data to be read with reference to the defect information table 225 loaded into the RAM 220. The address of the read data to be read may refer to a physical address converted through the processor 210 based on a logical address transmitted from the host apparatus.

When the address corresponding to the defective bit line is included to the address of the read data to be read as a determination result, the defect skip block 235 may proceed to operation S660. When the address corresponding to the defective bit line is not included in the address of the read data to be read, the defect skip block 235 may proceed to operation S670.

In operation S660, the defect skip block 235 may generate read data, in which the dummy bit corresponding to the defective bit line among bits of read data is removed, the bits of the MSB side with reference to the dummy bit are shifted by one bit to a lower bit direction, and a bit order of the data is changed to a reverse order, and output the generated read data to the RAM 220 by changing the bit order of the generated read data to a reverse order again.

In operation 670, the defect skip block 235 may generate normal read data which has the same bit values as the data read from the nonvolatile memory device 100 and the bit order thereof is changed to the reverse order, and output the generated normal read data to the RAM 220 by changing the bit order of the normal read data to a reverse order again.

Figure 7:
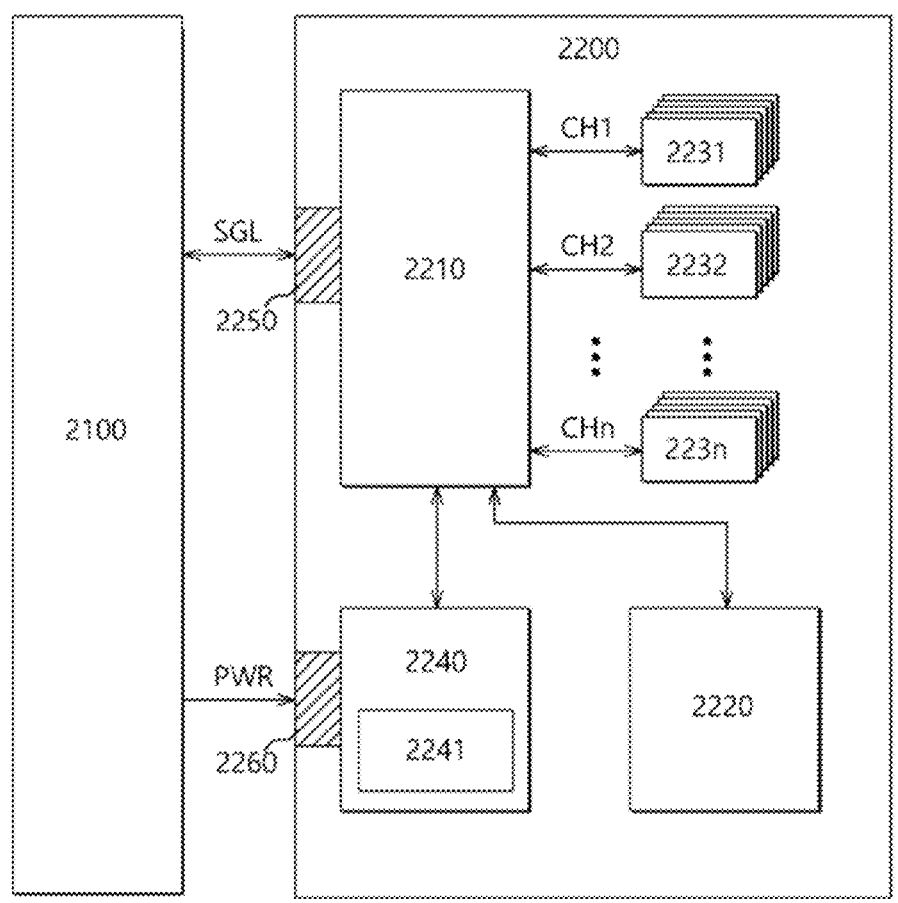
FIG. 7 is a diagram illustrating an example of a data processing system including a solid state drive (SSD) according to an embodiment of the present disclosure.

FIG. 7 is a diagram illustrating an example of a data processing system including a solid state drive (SSD) according to an embodiment, Referring to FIG. 7, a data processing system 2000 may include a host apparatus 2100 and a SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn.

One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured as various types of connectors according to an interfacing method between the host apparatus 2100 and the SSD 2200.

Figure 8:
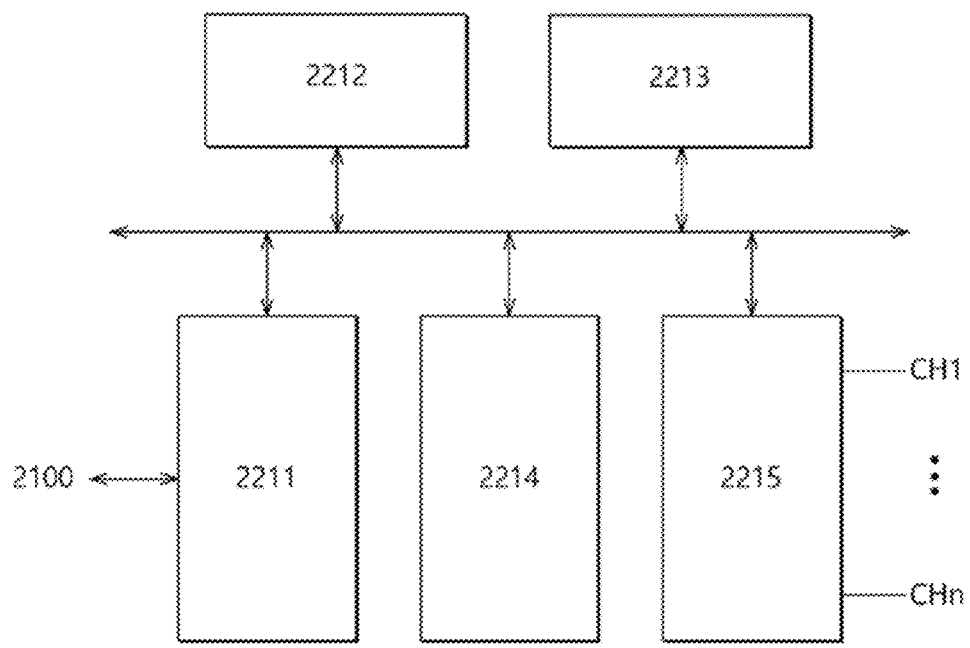
FIG. 8 is a diagram illustrating an exemplary configuration of a controller illustrated in FIG. 7.

FIG. 8 is a diagram illustrating an example of the controller 2210 of FIG. 7. Referring to FIG. 8, the controller 2210 may include a host interface unit 2211, a control unit 2212, a random access memory (RAM) 2213, an error correction code (ECC) unit 2214, and a memory interface unit 2215.

The host interface unit 2211 may perform interfacing between the host apparatus 2100 and the SSD 2200 according to a protocol of the host apparatus 2100. For example, the host interface unit 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface unit 2211 may perform a disc emulation function that the host apparatus 2100 recognizes the SSD 2200 as a general-purpose data storage apparatus, for example, a hard disc drive HDD.

The control unit 2212 may analyze and process the signal SGL received from the host apparatus 2100. The control unit 2212 may control operations of internal functional blocks according to firmware and/or software for driving the SDD 2200. The RAM 2213 may be operated as a working memory for driving the firmware or software.

The ECC unit 2214 may generate parity data for the data to be transferred to the nonvolatile memory devices 2231 to 223n. The generated parity data may be stored in the nonvolatile memory devices 2231 to 223n together with the data. The FCC unit 2214 may detect errors for data read from the nonvolatile memory devices 2231 to 223n based on the parity data. When detected errors are within a correctable range, the ECC unit 2214 may correct the detected errors.

The memory interface unit 2215 may provide a control signal such as command and an address to the nonvolatile memory devices 2231 to 223n according to control of the control unit 2212. The memory interface unit 2215 may exchange data with the nonvolatile memory devices 2231 to 223n according to control of the control unit 2212. For example, the memory interface unit 2215 may provide data stored in the buffer memory device 2220 to the nonvolatile memory devices 2231 to 223n or provide data read from the nonvolatile memory devices 2231 to 223n to the buffer memory device 2220.

Figure 9:
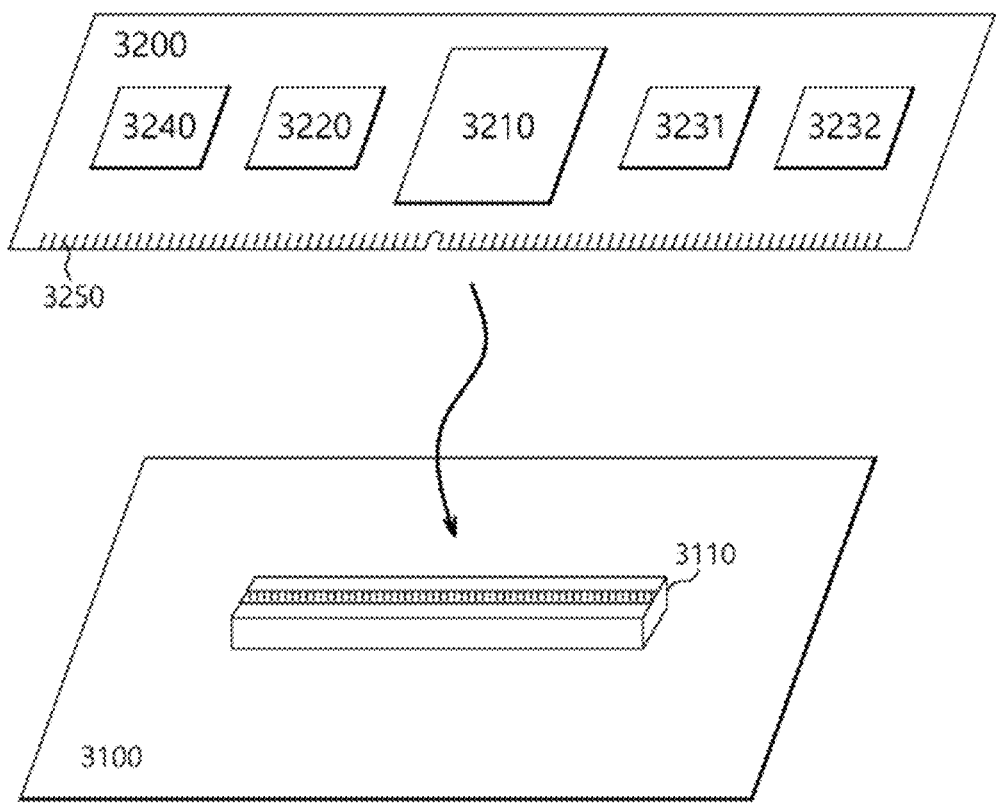
FIG. 9 is a diagram illustrating a data processing system including a data storage apparatus according to an embodiment of the present disclosure.

FIG. 9 is a diagram illustrating an example of a data processing system including a data storage apparatus according to an embodiment. Referring to FIG. 9, a data processing system 3000 may include host apparatus 3100 and a data storage apparatus 3200.

The host apparatus 3100 may be configured in a board form such as a printed circuit board (PCB). Although not shown in FIG. 9, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 7.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3210 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 10:
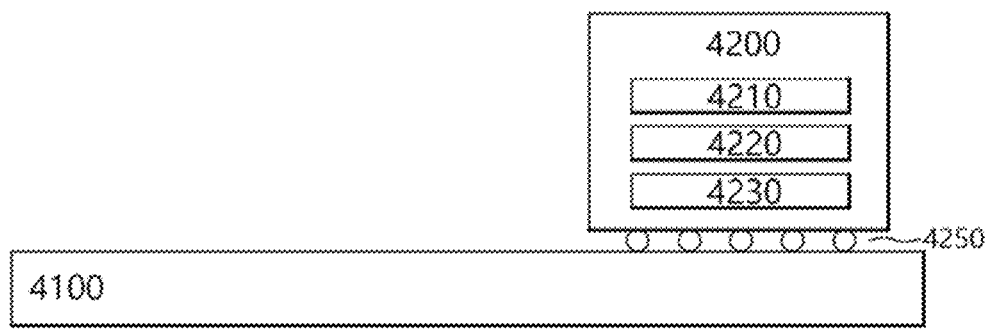
FIG. 10 is a diagram illustrating a data processing system including a data storage apparatus according to another embodiment of the present disclosure.

FIG. 10 is a diagram illustrating an example of a data processing system including a data storage apparatus according to an embodiment. Referring to FIG. 10, a data processing system 4000 may include a host apparatus 4100 and a data storage apparatus 4200.

The host apparatus 4100 may be configured in a board form such as a PCB. Although not shown in FIG. 10, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 7.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 according to control of the controller 4210.

The nonvolatile memory device 4230 may be used as a storage medium of the data storage apparatus 4200.

Figure 11:
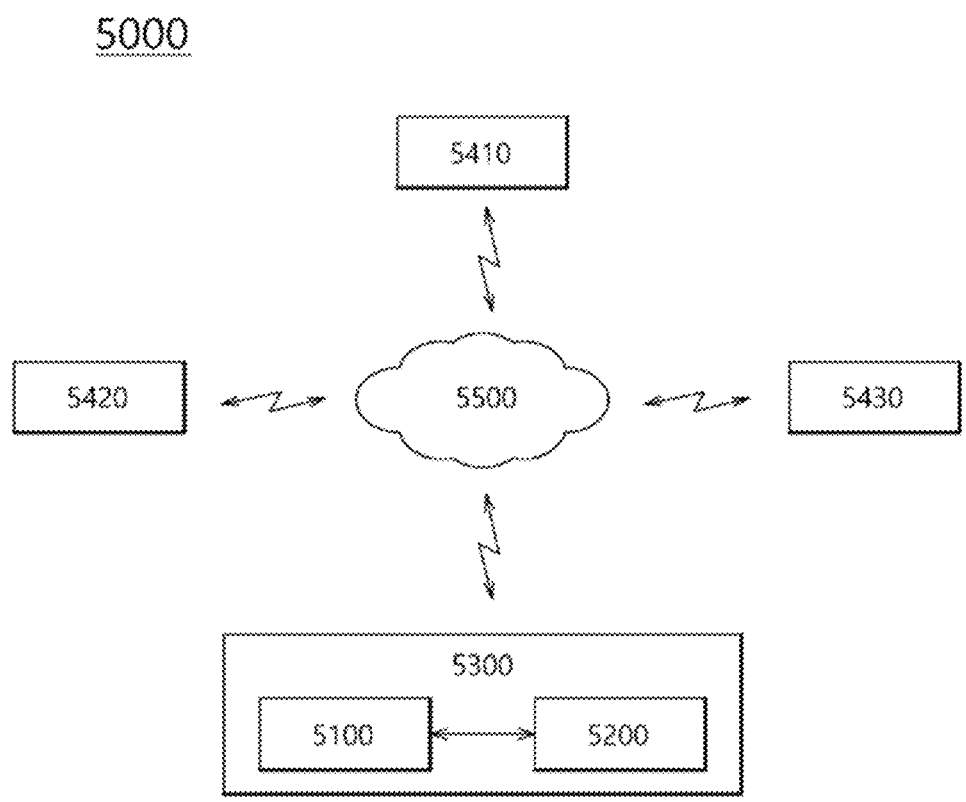
FIG. 11 is a diagram illustrating an example of a network system including a data storage apparatus according to yet another embodiment of the present disclosure.

FIG. 11 is a diagram illustrating an example of a network system 5000 including a data storage apparatus according to an embodiment, Referring to FIG. 11, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured as the data storage apparatus 10 of FIG. 1, the data storage apparatus 2200 of FIG. 7, the data storage apparatus 3200 of FIG. 9, or the data storage apparatus 4200 of FIG. 10.

Figure 12:
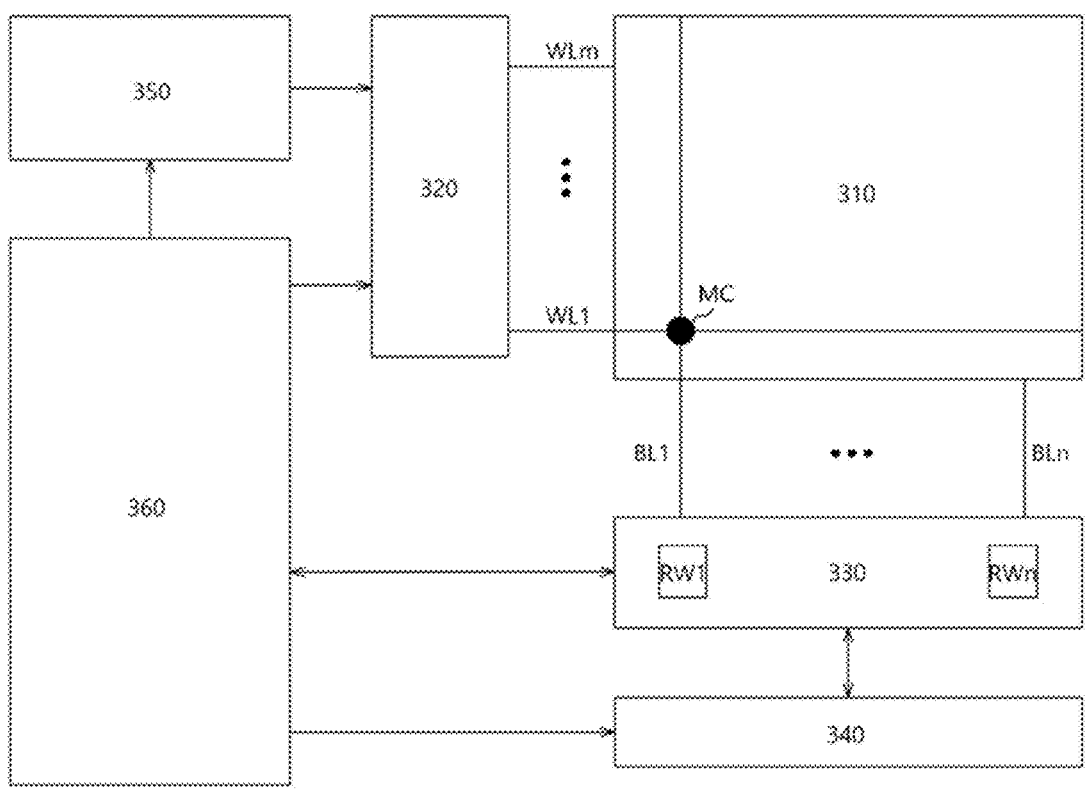
FIG. 12 is block diagram illustrating an exemplary configuration of a nonvolatile memory device included in a data storage apparatus according to yet another embodiment of the present disclosure.

FIG. 12 is a block diagram illustrating an example of a nonvolatile memory apparatus included in a data storage apparatus according to an embodiment. Referring to FIG. 12, a nonvolatile memory device 300 may include a memory cell array 310, a row decoder 320, a column decoder 340, a data read/write block 330, a voltage generator 350, and a control logic 360.

The memory cell array 310 may include memory cells MC arranged in regions in which word lines WL1 to WLm and bit lines BL1 to BLn cross to each other.

The row decoder 320 may be coupled to the memory cell array 310 through the word lines WL1 to WLm. The row decoder 320 may operate through control of the control logic 360. The row decoder 320 may decode an address provided from an external apparatus (not shown). The row decoder 320 may select and drive the word lines WL1 to WLm based on a decoding result. For example, the row decoder 320 may provide a word line voltage provided to the voltage generator 350 to the word lines WL to WLm.

The data read/write block 330 may be coupled to the memory cell array 310 through the bit lines BL1 to BLn. The data read/write block 330 may include read/write circuits RW1 to RWn corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as the write driver configured to store data provided from an external apparatus in the memory cell array 310 in a write operation mode. In another example, the data read/write block 330 may operate as the sense amplifier configured to read data from the memory cell array 310 in a read operation.

The column decoder 340 may operate though control of the control logic 360. The column decoder 340 may decode an address provided from the external apparatus. The column decoder 340 may couple the read/write circuits RW1 to RWn of the data read/write block 330 corresponding to the bit lines BL1 to BLn and data input/output (I/O) lines (or data I/O buffers) based on a decoding result.

The voltage generator 350 may generate voltages used for an internal operation of the nonvolatile memory device 300. The voltages generated through the voltage generator 350 may be applied to the memory cells of the memory cell array 310. For example a program voltage generated in a program operation may be applied to word lines of memory cells in which the program operation is to be performed. In another example, an erase voltage generated in an erase operation may be applied to well regions of memory cells in which the erase operation is to be performed. In another example, a read voltage generated in a read operation may be applied to word lines of memory cells in which the read operation is to be performed.

The control logic 360 may control an overall operation of the nonvolatile memory device 300 based on a control signal provided from an external apparatus. For example, the control logic 360 may control an operation of the nonvolatile memory device 300 such as a read operation, a write operation, an erase operation of the nonvolatile memory device 300.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A data storage apparatus comprising:
   a nonvolatile memory device; and
   a controller configured to determine whether or not one or more addresses of defective bit lines are included in an address of a write data to be written into the nonvolatile memory device or an address of a read data read from the nonvolatile memory device, and write the write data or read the read data by skipping the defective bit lines based on a determination result,
   wherein the controller includes a defect skip block configured to determine whether or not the addresses of the defective bit lines are included in the address of the write data or the address of the read data with reference to a defect information table, which stores information of the addresses of the defective bit lines, and generating the write data, in which dummy bit values are inserted into locations corresponding to the defective bit lines, or generating the read data, in which the dummy bit values are removed, when the addresses of the defective bit lines are included.

2. The data storage apparatus of claim 1, wherein the defect skip block includes:
   a data queue configured to queue the write data or the read data on a FIFO basis;
   a bit shifter configured to shift the write data provided from the data queue or the read data provided from an interleaver/deinterleaver; and
   the interleaver/deinterleaver configured to generate the write data by inserting the dummy bit values into the locations corresponding to the defective bit lines in the write data and shifting next bit values, and generate the read data by removing the dummy bit values from the read data, shifting next bit values, and changing a bit order of the shifted data to a reverse order.

3. The data storage apparatus of claim 2,
   wherein the write data is generated by shifting the next bit values to an upper bit direction, and
   wherein the read data is generated by shifting the next bit values to a lower bit direction.

4. The data storage apparatus of claim 2,
   wherein the defect skip block further includes a data transmission line configured to transmit the read data to the data queue from the bit shifter, and
   wherein the data transmission line transmits the read data by changing a bit order of the read data to a reverse order.

5. The data storage apparatus of claim 2, wherein the bit shifter includes an upper region coupled to the data queue and a lower region coupled to the interleaver/deinterleaver.

6. The data storage apparatus of claim 5,
   wherein the data queue provides the write data to the upper region, and
   wherein the bit shifter shifts next write data input to the upper region to the lower region by a number of bits corresponding to a unit of a write operation minus the number of defective bit lines when the bits corresponding to the defective bit lines are included in the previous write data output from the interleaver/deinterleaver.

7. The data storage apparatus of claim 6, wherein the bit shifter outputs a partial bit of the previous write data and a partial bit of the next write data to the interleaver/deinterleaver and shifts the next write data to the lower region by the number of detective bit lines.

8. The data storage apparatus of claim 5,
   wherein the interleaver/deinterleaver provides the read data to the lower region, and
   wherein when the dummy bit values corresponding to the defective bit lines are included in previous read data, the bit shifter shifts the previous read data to the upper region by a number of bits corresponding to a unit of a read operation minus the number of defective bit lines, and shifts next read data input to the lower region to the upper region by the number of defective bit lines.

9. The data storage apparatus of claim 8, wherein the bit shifter outputs a partial bit of the previous read data and a partial bit of the next read data to the data queue, and shifts the next read data to the upper region by a number of bits corresponding to the unit of a read operation minus the number of defective bit lines.

10. The data storage apparatus of claim 1, wherein the controller further includes a processor configured to detect the defective bit lines of the nonvolatile memory device, generate the defect information table based on the detected defective bit lines, and store the generated defect information table to the nonvolatile memory device.

11. The data storage apparatus of claim 10,
    wherein the processor stores a plurality of defect information tables in the nonvolatile memory device, and
    wherein the defect information tables are stored to be shifted by one bit.

12. The data storage apparatus of claim 11, wherein the processor loads an error correction code (ECC) decoded defect information table among the plurality of defect information tables stored in the nonvolatile memory device into a random access memory.

13. The data storage apparatus of claim 1,
    wherein the controller further includes a memory interface configured to transmit and receive data to and from the nonvolatile memory device, and
    wherein the defect skip block is included in the memory interface.

14. A data storage apparatus comprising:
a nonvolatile memory device; and
a controller configured to generate write data, in which dummy bit values are inserted into locations corresponding to the defective bit lines and next bit values are shifted, and transmit the write data to the nonvolatile memory device in a write operation and generate read data, in which the dummy bit values read from the defective bit lines are removed and next bit values are shifted, and transmit the read data to a host apparatus in a read operation.

15. An operation method of a data storage apparatus which includes a nonvolatile memory device, the method comprising:
determining whether or not addresses of defective bit lines are included in an address of write data to be written into the nonvolatile memory device or an address of read data read from the nonvolatile memory device; and
generating write data, in which a dummy bit value is inserted into locations corresponding to the defective bit lines and next bit values are shifted, and transmitting the write data to the nonvolatile memory device, or generating read data, in which the dummy bit values read from the defective bit lines are removed and next bit values are shifted, and transmitting the read data to the host apparatus when the addresses of the defective bit lines are included in the address of the write data or the address of the read data.

16. The method of claim 15, wherein the generating of the read data further includes changing a bit order of the read data to a reverse order.

17. The method of claim 16, wherein the transmitting of the read data to the host apparatus includes transmitting the read data to the host apparatus by changing the bit order of the read data to an original order.

* * * * *